(12) United States Patent
Cheng et al.

(10) Patent No.: US 6,949,469 B1
(45) Date of Patent: Sep. 27, 2005

(54) METHODS AND APPARATUS FOR THE OPTIMIZATION OF PHOTO RESIST ETCHING IN A PLASMA PROCESSING SYSTEM

(75) Inventors: Yu Cheng, Fremont, CA (US); Helen Zhu, Fremont, CA (US); Vinay V. Phoray, Fremont, CA (US); Hanzhong Xiao, Pleasanton, CA (US); Peter K. Loewenhardt, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/738,360

(22) Filed: Dec. 16, 2003

(51) Int. Cl.$^7$ .................. H01L 21/302; H01L 21/461
(52) U.S. Cl. ..................................... 438/725; 438/710
(58) Field of Search .......................... 438/725, 707, 438/738, 727, 710

(56) References Cited

U.S. PATENT DOCUMENTS

| | | | |
|---|---|---|---|
| 6,083,844 A | 7/2000 | Bui-Le et al. | |
| 6,235,644 B1 | 5/2001 | Chou | |
| 6,297,163 B1 | 10/2001 | Zhu et al. | |
| 6,319,815 B1 * | 11/2001 | Iguchi et al. | 438/624 |
| 6,432,832 B1 * | 8/2002 | Miller et al. | 438/713 |
| 6,693,043 B1 * | 2/2004 | Li et al. | 438/725 |

OTHER PUBLICATIONS

Ellingboe, Bert, "Plasma Processing In The Microelectronics Industry", Plasma Research Laboratory, paper.
"Research", http://graves-lab.cchem.berkeley.edu/~humbird/research/.
Lassig et al., Selective Removal Strategies for Low k Dual Damascene, Semiconductor Fabtech, pp 185-190.
EEE435/591 Microelectronics: Lecture 16: Back-end Processes.
EE 539TM/M(S)E 599TM—Lecture C2: Lithography-based Systems.
Hanawa, Tesuro (Group 1), "Current Status of Photolithography/Etching", Semiconductor Leading Edge Technologies, Inc. May 31, 2000 Selete Program Update.
Jones et al., "Micro Photocell Monitoring Finds the Killers", Summer 2003, Yield Management Solutions, pp. 38-45.
Woods, Eric, "Plasma Etching", CMOS Group, Microelectronics Research Center, Georgia Institute of Technology.
Muscat, Anthony, "Gas Phase Cleaning of Silicon Wafer Surfaces", http://www.che.arizona.edu/directory/faculty/muscat/research/Tutorials/Gas_Phase_Wafer_Clean.html.
Spitzlsperger, Gerhard, "Introduction to Low Pressure Glow Discharges for Semiconductor Manufacturing with Special Emphasis on Plasma Etching", http://www.gs68.de/tutorials/plasma/node26.html.

* cited by examiner

*Primary Examiner*—Caridad Everhart
(74) *Attorney, Agent, or Firm*—IP Strategy Group, P.C.

(57) ABSTRACT

In a plasma processing system, a method of minimizing the differences in an etch rate of a photo resist material in different regions of a substrate is disclosed. The method includes introducing the substrate having in sequential order thereon, an underlying layer and the photo-resist layer. The method also includes flowing the etchant gas mixture into a plasma reactor of the plasma processing system, the etchant gas mixture comprising a flow of a fluorine containing gas between about 0.1% and about 10% of the etchant gas mixture. The method further includes striking a plasma from the gas mixture; etching the photo-resist layer with the plasma; and, removing the substrate from the plasma reactor.

24 Claims, 7 Drawing Sheets

METHODS AND APPARATUS FOR THE OPTIMIZATION OF PHOTO RESIST ETCHING IN A PLASMA PROCESSING SYSTEM

BACKGROUND OF THE INVENTION

The present invention relates in general to substrate manufacturing technologies and in particular to methods and apparatus for the optimization of photo resist.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photo resist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck or pedestal. Appropriate etchant source are then flowed into the chamber and struck to form a plasma to etch exposed areas of the substrate.

Among the most common substrate manufacturing approaches are dual damascene substrates. In one example, called Via-First, the substrate is first coated with photo resist and then the vias are lithographically patterned. Next, an anisotropic etch cuts through the surface hard mask and etches down through the dielectric layers (such as silicon oxide, low-K materials) of the substrate, and stops on a barrier (such as silicon nitride, silicon carbide), just above the underlying metal layer. Next, the via photo resist layer is stripped, and the trench photo resist is applied and lithographically patterned. Some of the photo resist will remain in the bottom of the via and prevent the lower portion via from being over-etched during the trench etch process. A second anisotropic etch then cuts through the surface hard mask and down through the low K material, stopping at the embedded hard mask. This etch forms the trench. The photo resist is then stripped and the Silicon Nitride barrier at the bottom of the via is opened with a very soft, low-energy etch that will not cause the underlying copper to sputter into the via. As described above, the trench and via are filled with a conductive material (e.g., aluminum (Al), Copper (Cu), etc.) and polished by chemical mechanical polishing (CMP).

In another example, called trench-first. In one example, the substrate is coated with photo resist and a trench lithographic pattern is applied. An anisotropic dry etch then cuts through the surface hard mask (again typically plasma silicon nitride), and down through the low-k dielectric, stopping on the embedded etch stop layer (also typically silicon nitride). The photo resist is then stripped, leaving behind a trench. Next, the substrate is again coated with photo resist and a via lithographic pattern is applied. The via etch then cuts through the embedded etch stop layer to the final silicon nitride barrier located at the bottom of the via. The bottom barrier is then opened with a special etch and the photo resist is stripped.

In these, and other substrate processing methodologies, photo resist may be employed in order to prevent over-etching of particular substrate features (e.g., plug, trench, via, etc.). For example, when the photo resist is added as a blanket and then etched back, such as when trenches are being formed for dual-damascene structures, it is fairly difficult to apply a perfectly uniform layer of photo resist. Because underlying structures are already present on the substrate, photo resist tends to form in a topographic pattern, creating hills and valleys. As photo resist is etched away, areas on the substrate with a higher topography take longer to etch than areas with a lower topography. Subsequently, non-uniform photo resist profiles among the trenches may be created, potentially causing quality problems. This generally requires that either the plasma process is optimized for the lower topography, in which excess PR remains in areas of high topography, or the plasma process is optimized for higher topography, in which over etching can potentially occur in a feature.

It is generally believed in the art that a fluorine-based etchant should not used to etch photo resist, since it tends to also have a low substrate selectivity. Steve Lassig, et al., *Selective Removal Strategies for Low k Dual Damascene*, Semiconductor Fabtech, pp 185–190 (2001), discusses the addition of small amounts of a fluorine containing gas during various etch processes (e.g., oxide, dual damascene, etc.) in order to facilitate residue removal. In general, etch processes often leave polymer-like films and residues that must be removed along with the remaining photoresist material. The addition of small quantities of a fluorocarbon gas, such as $CF_4$, may be added to facilitate residue removal with little impact on critical dimensions (CD). However, use of a fluorine containing gas during blanket photo resist etching has generally been avoided in the art, since it may also attack and potentially damage previously created features on the substrate surface.

Figure 1A:
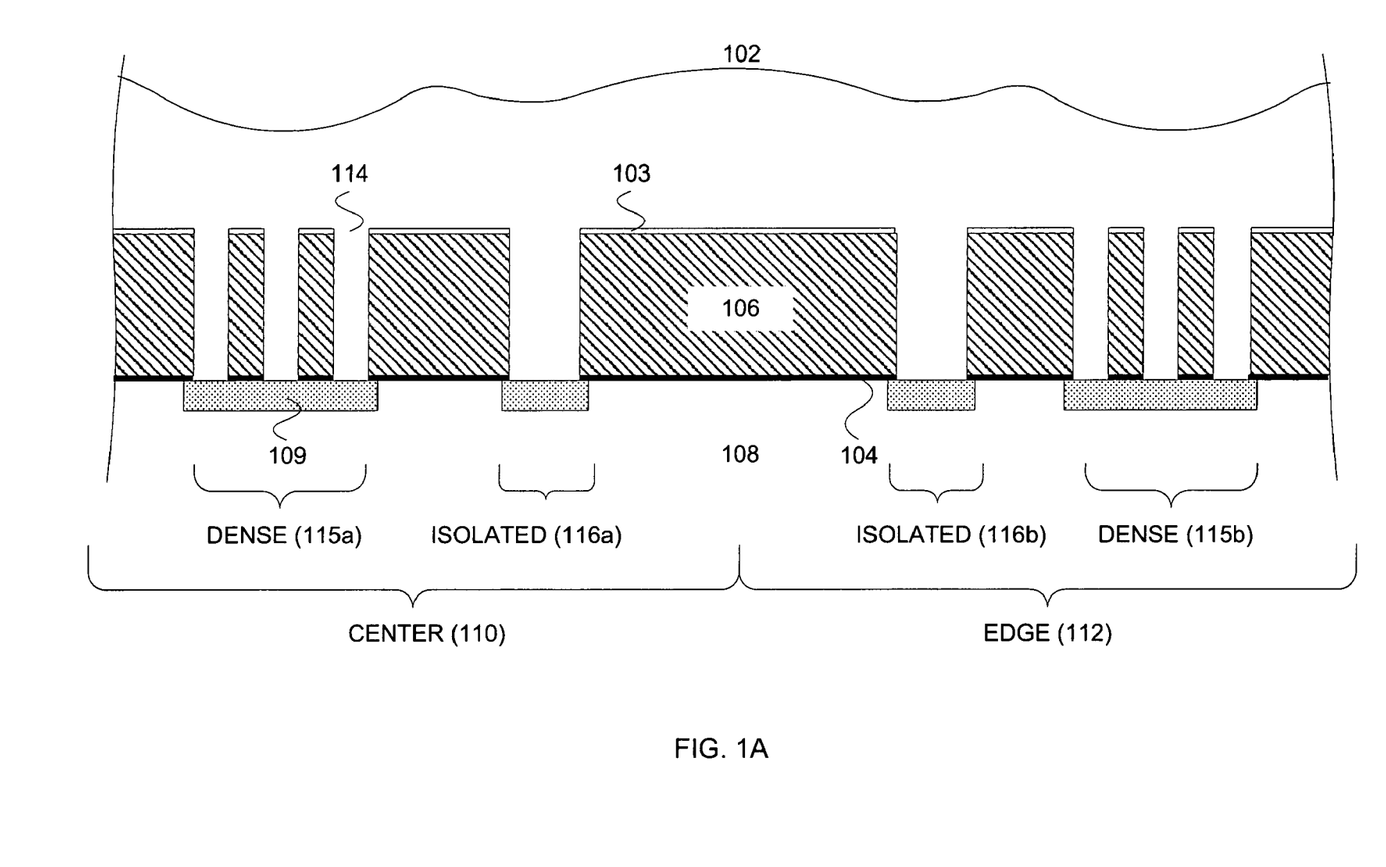
FIGS. 1A–B show an idealized cross-sectional view of a substrate with a blanket of photo resist.
Figure 1B:
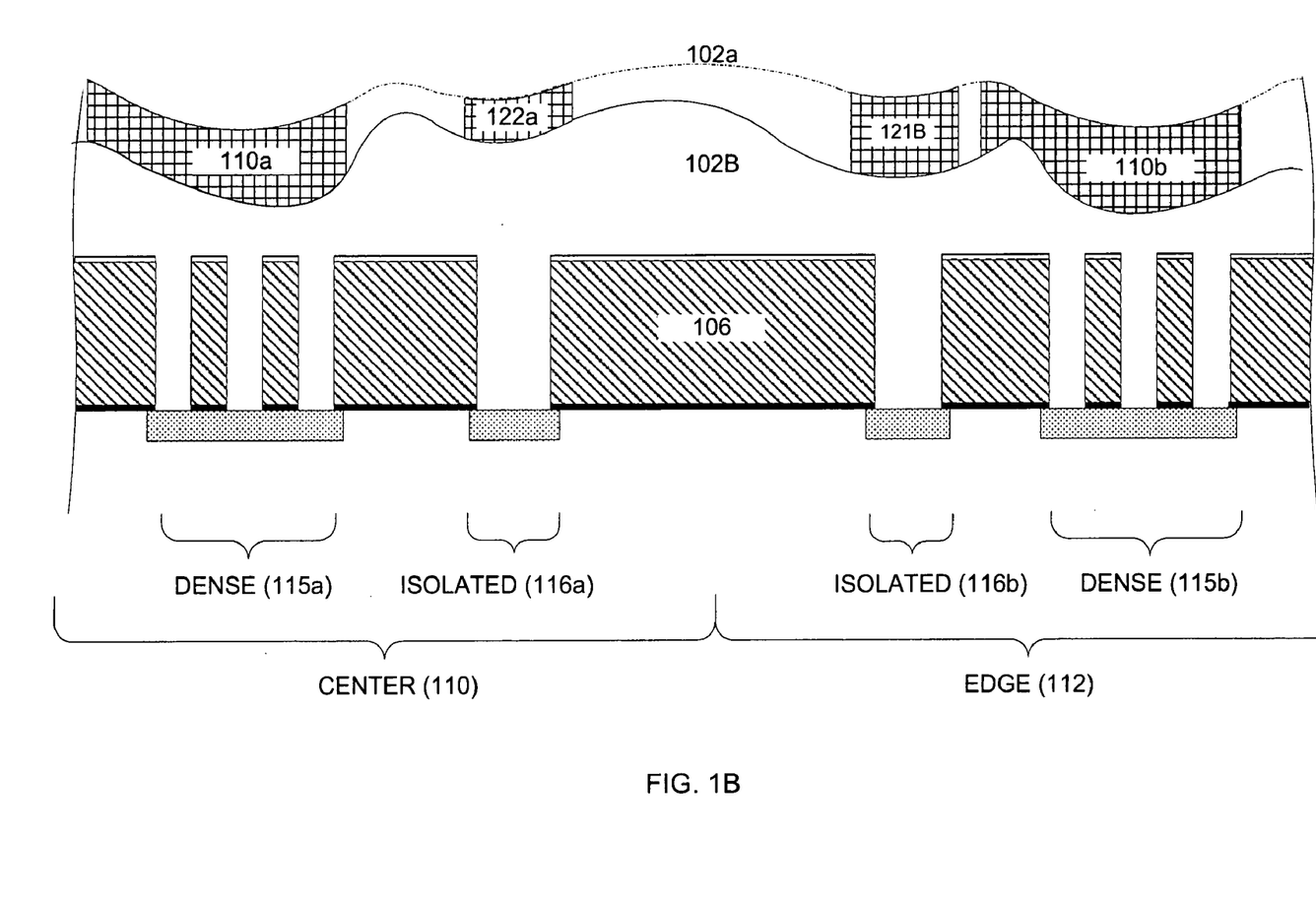

FIGS. 1A–B show an idealized cross-sectional view of a substrate with a blanket of photo resist. In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. The terms center and edge refer to relative positions on the surface of the substrate, with the edge portion being placed closer to the edge ring than the center portion. Furthermore, not all of the shown layers need necessarily be present and some or all may be substituted by other different layers.

Referring now to FIG. 1A, an idealized cross-sectional view of a substrate is shown. At the bottom of the substrate, there is shown a layer 108, typically comprising SiO2. Above layer 108 is disposed a barrier layer 104, typically comprising nitride or carbide (SiN or SiC). Dual damascene substrates further comprise a set of metal layers 109, typically comprising aluminum or copper, and a set of trenches or vias 114 which tend to be clustered in dense areas 115 or isolated in isolated areas 116. Above the barrier layer 104, is disposed a intermediate dielectric (IMD) layer 106, comprising a low K material (e.g., Coral, etc.). Above the IMD layer 106, there may be placed a cap layer 103, typically comprising SiO2. Above cap layer 103, there may be disposed a photo resist blanket 102. The substrate is further divided into a center portion 110 and an edge portion 112.

Referring now to FIG. 1B, the idealized cross-sectional view of the substrate of FIG. 1A is shown, after photo resist blanket 102a has been partially etched back to a point 102b. As previously described, as the plasma etches away the photo resist, areas on the substrate with a higher topography take longer to etch than areas with lower topography. For example, the amount of photo resist 102b that is remaining in dense regions 115 may be substantially less than the amount of material remaining in isolated regions 116.

Furthermore, the outer edge of the substrate may collect more electrons than the center (hence increasing the corresponding etch rate) since the edge is closer to the plasma potential. For example, the difference in the amount of photo resist 102b that has been etched from dense area 110b (located close to the substrate edge 112) tends to be substantially greater than the corresponding amount of photo resist that is etched from dense area 110a (located close to the substrate center 110). Likewise, the difference in the amount of photo resist 102b that has been etched from isolated area 122b (located close to the substrate edge 112) also tends to be substantially greater than the amount of photo resist etched from isolated area 122a (located close to the substrate center 110).

In addition, photo resist etch back processes may also be susceptible to micro loading and RIE lag issues. Micro loading usually refers to the dependence of the etching rate on pattern density for identical features, and it results from the depletion of reactants because the substrate has a local, higher-density unmasked area. Reactive Ion Etch (RIE) lag is the phenomenon in which narrower features etch slower than wider features. Micro loading and RIE lag issues become even more problematic as requirements for high circuit density on substrates continue to escalate, since they directly impact the performance and function of the substrate.

Figure 2:
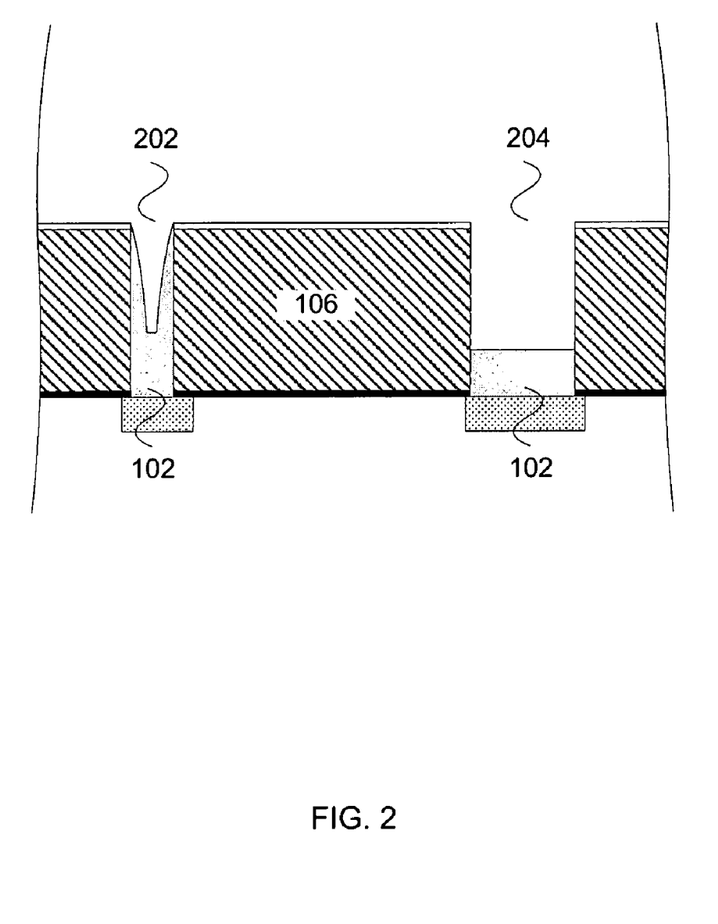
FIG. 2 shows an idealized cross-sectional view of the substrate in FIG. 1A in which RIE lag has caused the plasma to remove substantially less photo resist in a narrow feature than that removed in wide feature.

Referring now to FIG. 2, an idealized cross-sectional view of the substrate in FIG. 1A is shown in which RIE lag has caused the plasma to remove substantially less photo resist in narrow feature 202 than that removed in wide feature 204.

Figure 3:
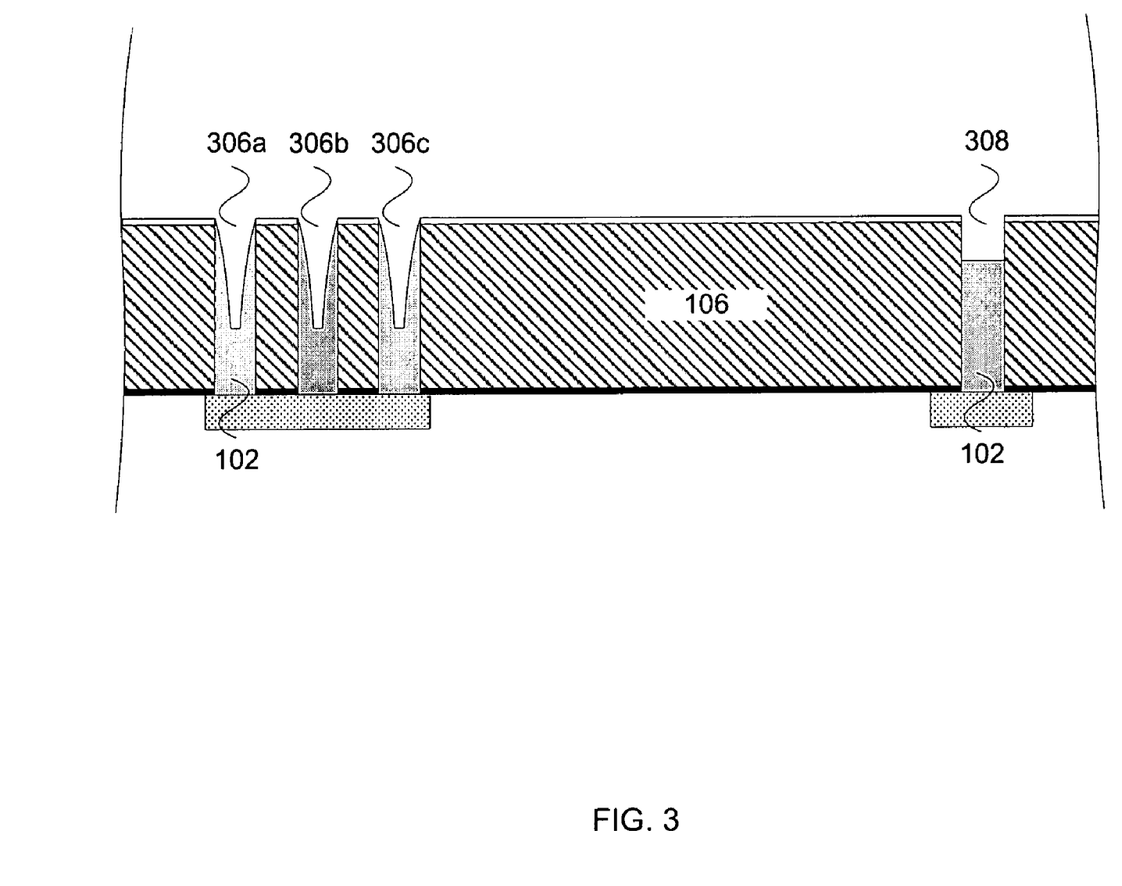
FIG. 3 shows an idealized cross-sectional view of the substrate in FIG. 1A in which microloading has caused the plasma to remove substantially less photo resist in the set of dense features than that removed in isolated feature.

Referring now to FIG. 3, an idealized cross-sectional view of a substrate in FIG. 1A is shown in which microloading has caused the plasma to remove substantially more photo resist in the set of dense features 306 than that removed in isolated feature 308.

In view of the foregoing, there are desired improved methods and apparatus for the optimization of photo resist etching in a plasma processing system.

SUMMARY OF THE INVENTION

The invention relates, in one embodiment, in a plasma processing system, to a method of minimizing the differences in an etch rate of a photo resist material in different regions of a substrate. The method includes introducing the substrate having in sequential order thereon, an underlying layer and the photo-resist layer. The method also includes flowing the etchant gas mixture into a plasma reactor of the plasma processing system, the etchant gas mixture comprising a flow of a fluorine containing gas between about 0.1% and about 10% of the etchant gas mixture. The method further includes striking a plasma from the gas mixture; etching the photo-resist layer with the plasma; and, removing the substrate from the plasma reactor.

The invention relates, in one embodiment, in a plasma processing system, to an apparatus for minimizing the differences in an etch rate of a photo resist material in different regions of a substrate. The apparatus includes a means of introducing a substrate having in sequential order thereon, an underlying layer and the photo-resist layer. The apparatus also includes a means of flowing the etchant gas mixture into a plasma reactor of the plasma processing system, the etchant gas mixture comprising a flow of a fluorine containing gas between about 0.1% and about 10% of the etchant gas mixture. The method further includes a means of striking a plasma from the gas mixture; a means of etching the photo-resist layer with the plasma; and, a means of removing the substrate from the plasma reactor.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the following paragraphs, approximate ranges believed to be suitable for performing the inventive method of improving process results through the introduction of additional gasses into a plasma processing chamber are disclosed. Although the suitable ranges are disclosed herein below in connection with an Exelan™ HPT plasma processing system, these ranges should serve as guidelines to enable one skilled in the art to adapt the disclosed methods to other plasma processing systems.

While not wishing to be bound by theory, it is believed by the inventor herein that a fluorine containing gas, when added to commonly used photo resist etchant gases, may help improve etch uniformity and reduce micro loading. In a non-obvious fashion, it was discovered that the addition of optimal amounts of a fluorine containing gas can help to substantially minimize differences in photo resist etch rates between dense and isolated regions of the substrate, between the center and edge regions of the substrate, and between narrow and wide features of the substrate, subsequently improving the electrical and functional characteristics of the substrate.

Generally, when blanket photo resist is deposited and then etched back, oxygen based etchants are used. Oxygen based etchants tend to have a low selectivity (and hence fairly aggressive) to the organic photo resist, and a high selectivity to the inorganic materials of the substrate (e.g., SiOC, etc.). In general, fluorine-based etchants are not commonly used, since they tend to have a low selectivity to the substrate. However, an optimal amount of a fluorine containing gas when present in photo resist etchant in a plasma processing system has been shown to have a high selectivity to the substrate.

As previously described, the initial photo resist blanket may not be applied in a uniform fashion, because of the topology of the underlying features. As the plasma etches away the photo resist, areas on the substrate with a higher topography take longer to etch than areas with lower topography, creating non-uniform photo resist profiles among the trenches or vias as the case may be. In addition, for a substrate in a plasma processing system, the outer edge of the substrate may collect more electrons than the center (hence increasing the corresponding etch rate) since the edge is closer to the plasma potential. Furthermore, a photo resist etch back processes may also be susceptible to micro loading and RIE lag issues.

While there may be many theories as to why the addition of an optimal amount of a fluorine containing gas may minimize the differences in the photo resist etch rate in difference regions of the substrate, the inventor believes that the blanket photo resist etch process is comprised of at least two phases, each of which may provide a separate reason as to why a fluorine containing gas minimizes differences in etch rate across different regions of the substrate. In a first phase, comprising initially etching the blanket photo resist to the surface of the substrate, the process of etching, particularly with an oxygen-based etchant, breaks down polymers in the boundary region between the photo resist and the etchant gas. It is believed that these polymers generally retard the etching process. Areas of the substrate with larger blanket photo resist areas, such as over isolated features, tend to break down faster than areas of the substrate with smaller blanket photo resist areas, such as over dense features, which subsequently tends to equalize the etch rate across the surface of the substrate.

In a second phase, comprising etching the blanket photo resist back from the surface of the substrate to a position within the feature itself (trench, via, etc.), the inventor further believes that a fluorine containing gas may interact with the feature wall and create another type of polymer which accelerates the etching process in narrower and isolated features, subsequently minimizing the effects of microloading and RIE lag. That is, the fluorine containing gas may help mitigate the dependence of the etching rate on pattern density for identical features, as well as tending to equalize the etch rate of narrow features with that of wider features.

Figure 4:
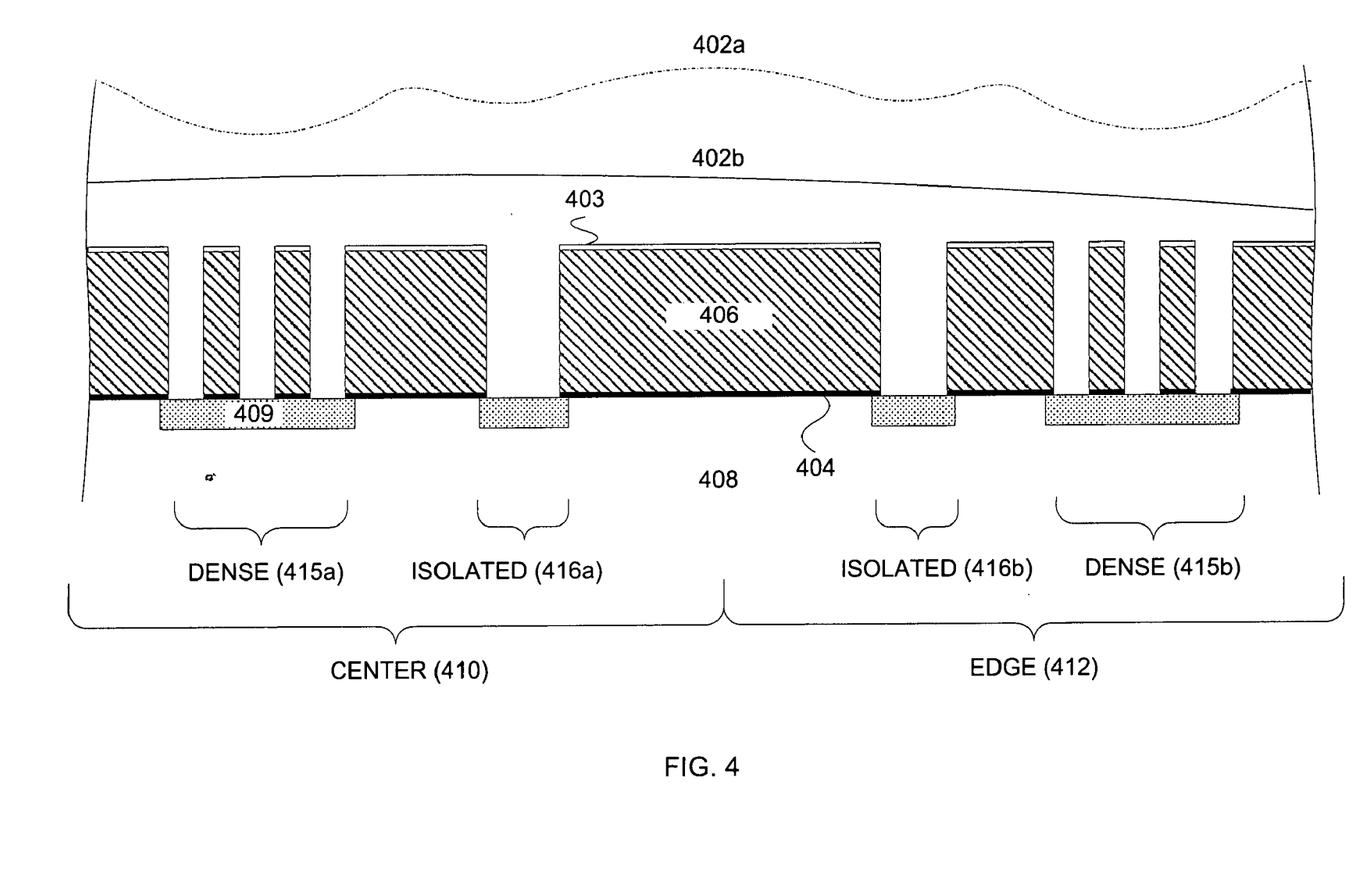
FIG. 4 shows an idealized cross-sectional view of a substrate in which the photo resist blanket has been partially etched back in a substantially uniform fashion, according to one embodiment of the invention.

FIG. 4 shows an idealized cross-sectional view of a substrate in which the photo resist blanket has been partially etched back in a substantially uniform fashion, in one embodiment of the invention. The use of fluorine containing gas during blanket photo resist etching has generally been avoided in the art, since fluorine containing gas may also attack and potentially damage previously created features on the substrate surface. In Lassig et al., supra at 187, the author discusses the addition of small amounts of a fluorine containing gas during various etch processes (e.g., oxide, dual damascene, etc.). However, this is generally only done in order to facilitate residue removal, and not during blanket photo resist etching.

Referring now to FIG. 4, at the bottom of the substrate, there is shown a layer 408, comprising SiO2. Above layer 408 is disposed a barrier layer 404, typically comprising nitride or carbide (SiN or SiC). Dual damascene substrates further comprise a set of metal layers 409, typically comprising aluminum or copper, and a set of trenches or vias 414 which tend to be clustered in dense areas 415 or isolated in isolated areas 416. Above the barrier layer 404, is disposed an intermediate dielectric (IMD) layer 406, comprising a low K material (e.g., Coral, etc.). Above the IMD layer 406, there may be placed a cap layer 403, typically comprising SiO2. Above cap layer 403, there may be disposed a photo resist blanket 402. The substrate is further divided into a center portion 420 and an edge portion 412. Initially, photo resist blanket 402a forms a topographic pattern that follows the underlying features. However, unlike the prior art, the addition of a fluorine containing gas has allowed etching process to progress at a uniform rate 402b.

For example, in a Lam Research Exelan™ HPT plasma processing system (at about 650 mT/0 w(27 MHz)/150 W(2 MHz)/20° C./125), a plasma comprising about 5 SCCM of a fluorine containing gas (standard cubic centimeters per minute), about 175 SCCM of N2, and about 175 SCCM of $O_2$, may substantially optimize the photo resist etch rate:

|  | EDGE DENSE (415b) | EDGE ISOLATED (416b) | CENTER DENSE (415a) | CENTER ISOLATED (416a) |
| --- | --- | --- | --- | --- |
| AVERAGE BLANKET PHOTO RESIST PRIOR TO ETCH | 760 nm | 894 nm | 725 nm | 888 nm |
| FIRST PHASE ETCH RATE WITH ADDITION OF A FLUORINE CONTAINING GAS | 641.8 nm/minute | 641.8 nm/minute | 610 nm/minute | 610 nm/minute |
| SECOND PHASE ETCH RATE WITH ADDITION OF A FLUORINE CONTAINING GAS | 760.7 nm/minute | 898.1 nm/minute | 768.9 nm/minute | 959.2 nm/minute |

In this example, the blanket photo resist etch rate at the center of the substrate 410 has been increased by 3.2%, while the blanket photo resist etch rate at the edge of the substrate 412 has been reduced by 3.4%. Furthermore, overall blanket etch rate uniformity has been improved from +/−7.8% to 4.1%.

Figure 5A:
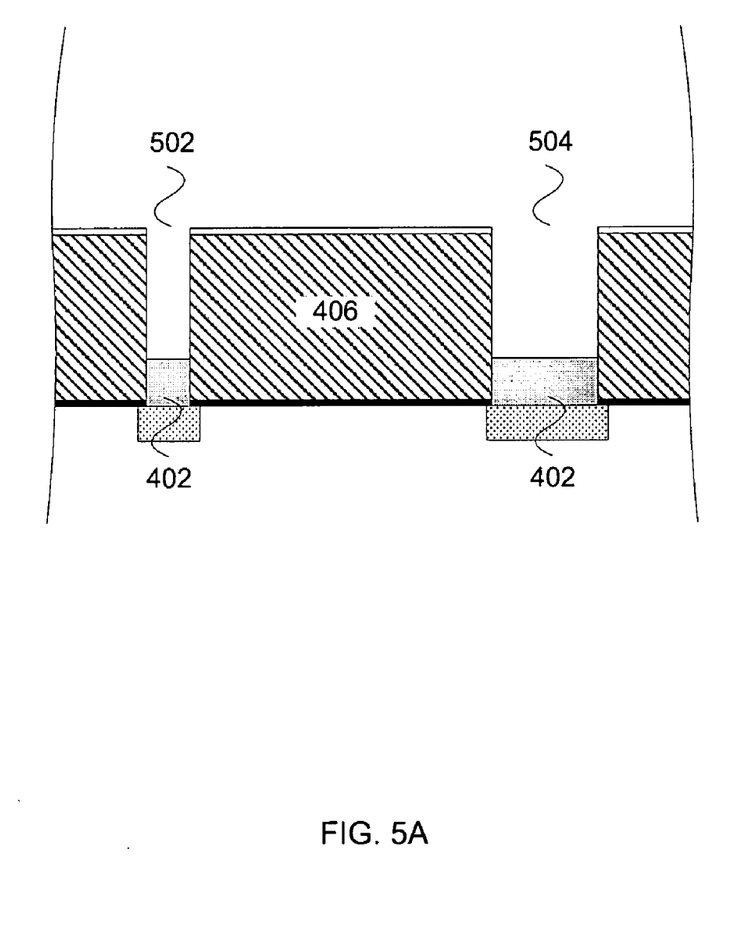
FIGS. 5A–B show an idealized cross-sectional view of a substrate after photo resist blanket has been etched back in order to prevent the over-etching of particular substrate features, such as a plug, trench or via, according to one embodiment of the invention.
Figure 5B:
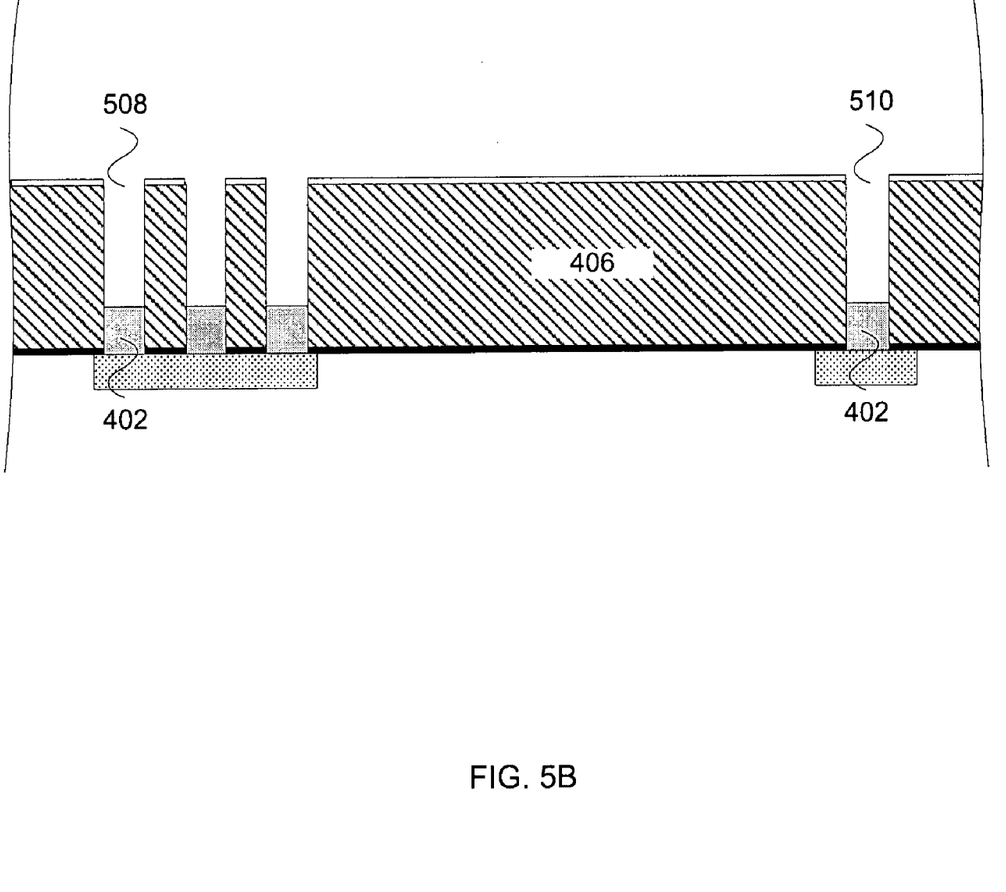

FIGS. 5A–B show an idealized cross-sectional view of the substrate in FIG. 4, after photo resist blanket 102 has been etched back in order to prevent the over-etching of particular substrate features, such as a plug, trench or via, in another embodiment of the invention. Referring now to FIG. 5A, an idealized cross-sectional view of a substrate is shown in which the effect of Etch (RIE) lag has been substantially optimized, allowing has narrow feature 502 that and wide feature 504 to have substantially similar photo resist amount. Referring now to FIG. 5B, an idealized cross-sectional view of a substrate is shown in which microloading has also been optimized, allowing the plasma to remove substantially similar photo resist in the set of dense features 506 than that removed in isolated feature 508.

In one embodiment, the addition of $CF_4$ (a fluorine containing gas), to a photo resist etchant comprising $O_2$ (oxygen gas), and optionally comprising N2 (nitrogen gas), in a plasma processing system can substantially optimize the photo resist etch rate. This can be chemically shown as:

$$CF_4+O_2+N_2$$

In a flow measured in SCCM (standard cubic centimeters per minute), the addition of a flow of $CF_4$ in a proportion that is between about 0.1% to about 10% of the total etchant gas flow optimizes photo resist etching sufficiently. A more preferable amount of photo resist optimization can be achieved with addition of a flow of $CF_4$ in a proportion that is between about 0.1% to about 5% of the total etchant gas flow. The most preferable amount of photo resist optimization can be achieved with addition of a flow of $CF_4$ in a proportion that is between about 1% to about 2% of the total etchant gas flow.

In another embodiment, the addition of $CHF_3$ (a fluorine containing gas), to a photo resist etchant comprising $O_2$ (oxygen gas), and optionally comprising $N_2$ (nitrogen gas), in a plasma processing system can substantially optimize the photo resist etch rate. This can be chemically shown as:

$$CHF_3+O_2+N_2$$

In a flow measured in SCCM (standard cubic centimeters per minute), the addition of a flow of $CHF_3$ in a proportion that is between about 0.1% to about 10% of the total etchant gas flow optimizes photo resist etching sufficiently. A more preferable amount of photo resist optimization can be achieved with addition of a flow of $CHF_3$ in a proportion that is between about 0.1% to about 5% of the total etchant gas flow. The most preferable amount of photo resist optimization can be achieved with addition of a flow of $CHF_3$ in a proportion that is between about 1% to about 2% of the total etchant gas flow.

In another embodiment, the addition of $CH_2F_2$ (a fluorine containing gas), to a photo resist etchant comprising $O_2$ (oxygen gas), and optionally comprising N2 (nitrogen gas), in a plasma processing system can substantially optimize the photo resist etch rate. This can be chemically shown as:

$$CH_2F_2+O_2+N_2$$

In a flow measured in SCCM (standard cubic centimeters per minute), the addition of a flow of $CH_2F_2$ in a proportion that is between about 0.1% to about 10% of the total etchant gas flow optimizes photo resist etching sufficiently. A more preferable amount of photo resist optimization can be achieved with addition of a flow of $CH_2F_2$ in a proportion that is between about 0.1% to about 5% of the total etchant gas flow. The most preferable amount of photo resist optimization can be achieved with addition of a flow of $CH_2F_2$ in a proportion that is between about 1% to about 2% of the total etchant gas flow.

In another embodiment, the addition of $CH_3F$ (a fluorine containing gas), to a photo resist etchant comprising $O_2$ (oxygen gas), and optionally comprising $N_2$ (nitrogen gas), in a plasma processing system can substantially optimize the photo resist etch ate. This can be chemically shown as:

$$CH_3F+O_2+N_2$$

In a flow measured in SCCM (standard cubic centimeters per minute), the addition of a flow of $CH_3F$ in a proportion that is between about 0.1% to about 10% of the total etchant gas flow optimizes photo resist etching sufficiently. A more preferable amount of photo resist optimization can be achieved with addition of a flow of $CH_3F$ in a proportion that is between about 0.1% to about 5% of the total etchant gas flow. The most preferable amount of photo resist optimization can be achieved with addition of a flow of $CH_3F$ in a proportion that is between about 1% to about 2% of the total etchant gas flow.

In another embodiment, the addition of $C_2F_2$ (a fluorine containing gas), to a photo resist etchant comprising $O_2$ (oxygen gas), and optionally comprising $N_2$ (nitrogen gas), in a plasma processing system can substantially optimize the photo resist etch rate. This can be chemically shown as:

$$C_2F_2+O_2+N_2$$

In a flow measured in SCCM (standard cubic centimeters per minute), the addition of a flow of $C_2F_2$ in a proportion that is between about 0.1% to about 10% of the total etchant gas flow optimizes photo resist etching sufficiently. A more preferable amount of photo resist optimization can be achieved with addition of a flow of $C_2F_2$ in a proportion that is between about 0.1% to about 5% of the total etchant gas flow. The most preferable amount of photo resist optimization can be achieved with addition of a flow of $C_2F_2$ in a proportion that is between about 1% to about 2% of the total etchant gas flow.

In another embodiment, the addition of CxHyFz (where x is an integer that is equal to or greater than 0, y is an integer that is equal to or greater than 0, and z is an integer that is equal to or greater than 1), to a photo resist etchant comprising $O_2$ (oxygen gas), and optionally comprising $N_2$ (nitrogen gas), in a plasma processing system can substantially optimize the photo resist etch rate. This can be chemically shown as:

$$CxHyFz+O_2+N_2$$

In a flow measured in SCCM (standard cubic centimeters per minute), the addition of a flow of CxHyFz in a proportion that is between about 0.1% to about 10% of the total etchant gas flow optimizes photo resist etching sufficiently. A more preferable amount of photo resist optimization can be achieved with addition of a flow of CxHyFz in a proportion that is between about 0.1% to about 5% of the total etchant gas flow. The most preferable amount of photo resist optimization can be achieved with addition of a flow of CxHyFz in a proportion that is between about 1% to about 2% of the total etchant gas flow.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, etc.). Also, photo resist plasma etchants comprising gases other than oxygen may be used. It should also be noted that there are many alternative ways of implementing the methods of the present invention.

Advantages of the invention include the optimization of photo resist etching in a plasma processing system. Additional advantages may include the improvement of photo resist uniformity across the surface of the substrate, as well as substantially reducing micro loading and minimizing RIE lag, particularly for dual damascene applications.

Having disclosed exemplary embodiments and the best mode, modifications and variations may be made to the disclosed embodiments while remaining within the subject and spirit of the invention as defined by the following claims.

What is claimed is:

1. In a plasma processing system having a plasma reactor, a method of performing partial photo resist etch on a blanket deposited layer of photo resist material, said blanket-deposited layer of photo resist material being disposed above a substrate having thereon surface topologies that include at least a dense region and an isolated region, comprising:
   introducing said substrate into said plasma reactor;
   flowing an etchant gas mixture into said plasma reactor, said etchant gas mixture comprising an optimal flow percentage of a fluorine containing gas between about 0.1% and about 10% of said etchant gas mixture;
   striking a plasma from said gas mixture;
   etching said photo-resist layer with said plasma, wherein said optimal flow percentage of said fluorine containing gas being configured to leave a substantially uniform thickness of said photo resist material in said dense region and said isolated region after said etching is terminated; and,
   removing said substrate from said plasma reactor.

2. The method of claim 1, wherein said etchant gas mixture further comprises flow of oxygen gas.

3. The method of claim 1, wherein said etchant gas mixture further comprises flow of nitrogen gas.

4. The method of claim 1, wherein said flow of a fluorine containing gas is between about 0.1% and about 5% of said etchant gas mixture.

5. The method of claim 1, wherein said flow of a fluorine containing gas is between about 1% and about 2% of said etchant gas mixture.

6. The method of claim 1, wherein said flow of a fluorine containing gas is $CF_4$.

7. The method of claim 1, wherein said flow of a fluorine containing gas is $CHF_3$.

8. The method of claim 1, wherein said flow of a fluorine containing gas is $CH_2F_2$.

9. The method of claim 1, wherein said flow of a fluorine containing gas is $CH_3F$.

10. The method of claim 1, wherein said flow of a fluorine containing gas is $C_2F_2$.

11. The method of claim 1, wherein said substrate is semiconductor wafer.

12. The method of claim 1, wherein substrate is a glass panel.

13. The method of claim 1 wherein said dense region and said isolated region represent trenches in a dual-damascene application.

14. In a plasma processing chamber, a method for processing a dual-damascene substrate, comprising:
   providing said substrate having thereon a low-K dielectric layer, said low-K dielectric layer having therein trenches located in at least one dense region and at least one isolated region, said dense region having a higher density of trenches than a density of trenches in said isolated region, said substrate further having a blanket-deposited layer of photo resist material deposited over said low-K dielectric layer in into said trenches;
   flowing an etchant gas mixture comprising oxygen, and an optimal flow percentage of fluorine containing gas into said plasma processing chamber;
   striking a plasma using said etchant gas mixture;
   etching said blanket-deposited layer of photo resist material using said plasma; and
   terminating said etching while some of said photo resist material remains in said trenches, said optimal flow percentage of said fluorine containing gas being selected to leave a substantially uniform thickness of said photo resist material in said one dense region and said one isolated region after said etching is terminated.

15. The method of claim 14, wherein said etchant gas mixture further comprises flow of nitrogen gas.

16. The method of claim 14, wherein said flow of a fluorine containing gas is between about 0.1% and about 5% of said etchant gas mixture.

17. The method of claim 14, wherein said flow of a fluorine containing gas is between about 1% and about 2% of said etchant gas mixture.

18. The method of claim 14, wherein said fluorine containing gas is $CF_4$.

19. The method of claim 14, wherein said fluorine containing gas is $CHF_3$.

20. The method of claim 14, wherein said fluorine containing gas is $CH_2F_2$.

21. The method of claim 14, wherein said fluorine containing gas is $CH_3F$.

22. The method of claim 14, wherein fluorine containing gas is $C_2F_2$.

23. The method of claim 14, wherein said substrate is semiconductor wafer.

24. The method of claim 14, wherein substrate is a glass panel.

* * * * *

UNITED STATES PATENT AND TRADEMARK OFFICE
CERTIFICATE OF CORRECTION

PATENT NO. : 6,949,469 B1　　　　　　　　　　　　　　　　　　　　　　　　　Page 1 of 1
DATED : September 27, 2006
INVENTOR(S) : Cheng, Yu et al.

It is certified that error appears in the above-identified patent and that said Letters Patent is hereby corrected as shown below:

Title page,
Item [75], Inventors, change "Phoray, Vinay V." to -- Pohray, Vinay V. --.

Signed and Sealed this

Second Day of May, 2006

JON W. DUDAS
*Director of the United States Patent and Trademark Office*

UNITED STATES PATENT AND TRADEMARK OFFICE
CERTIFICATE OF CORRECTION

PATENT NO. : 6,949,469 B1 Page 1 of 1
DATED : September 27, 2005
INVENTOR(S) : Cheng, Yu et al.

It is certified that error appears in the above-identified patent and that said Letters Patent is hereby corrected as shown below:

<u>Title page,</u>
Item [75], Inventors, change "Phoray, Vinay V." to -- Pohray, Vinay V. --.

This certificate supersedes Certificate of Correction issued May 2, 2006.

Signed and Sealed this

Twenty-third Day of May, 2006

JON W. DUDAS
*Director of the United States Patent and Trademark Office*